(12) United States Patent
Wang (10) Patent No.: US 11,063,119 B2
(45) Date of Patent: Jul. 13, 2021

(54) SEMICONDUCTOR STRUCTURE AND METHOD FOR FORMING THE SAME

(71) Applicants: Semiconductor Manufacturing International (Beijing) Corporation, Beijing (CN); Semiconductor Manufacturing International (Shanghai) Corporation, Shanghai (CN)

(72) Inventor: Nan Wang, Shanghai (CN)

(73) Assignees: Semiconductor Manufacturing (Beijing) International Corporation, Beijing (CN); Semiconductor Manufacturing (Shanghai) International Corporation, Shanghai (CN)

( * ) Notice: Subject to any disclaimer, the term of this patent is extended or adjusted under 35 U.S.C. 154(b) by 175 days.

(21) Appl. No.: 16/601,855

(22) Filed: Oct. 15, 2019

(65) Prior Publication Data

US 2020/0243649 A1 Jul. 30, 2020

(30) Foreign Application Priority Data

Jan. 29, 2019 (CN) .......................... 201910086398.8

(51) Int. Cl.
*H01L 29/06* (2006.01)
*H01L 29/10* (2006.01)
(Continued)

(52) U.S. Cl.
CPC .. *H01L 29/1037* (2013.01); *H01L 21/823807* (2013.01); *H01L 21/823814* (2013.01);
(Continued)

(58) Field of Classification Search
CPC ............. H01L 29/1037; H01L 29/6681; H01L 29/785; H01L 27/0924; H01L 21/823814; H01L 21/823821; H01L 21/823807
See application file for complete search history.

(56) References Cited

U.S. PATENT DOCUMENTS

2019/0198645 A1* 6/2019 Cheng ............... H01L 29/66553

\* cited by examiner

*Primary Examiner* — Khaja Ahmad
*Assistant Examiner* — Pavel G Ivanov
(74) *Attorney, Agent, or Firm* — Brinks Gilson & Lione (57) ABSTRACT

Disclosed are a semiconductor structure and a method for forming same. A forming method includes: forming a first inside wall in a first groove; etching an initial channel laminated layer and an initial fin after the first inside wall is formed, where the residual initial fin is used as a fin, and the residual initial channel laminated layer located on the fin is used to form a channel laminated layer, the channel laminated layer includes a composite layer and a channel layer located on the composite layer, and the composite layer includes a first inside wall and a sacrificial layer located on a sidewall of the first inside wall; forming a pseudo gate structure across the channel laminated layer after the fin is formed; forming a source-drain doping layer in channel laminated layers on two sides of the pseudo gate structure; and removing the pseudo gate structure and the sacrificial layer after the source-drain doping layer is formed, and forming a metal gate structure at positions of the pseudo gate structure and the sacrificial layer. The first inside wall provides support for the channel layer. Therefore, even though the channel layer is relatively long, the channel layer cannot easily deform or collapse under the gravity effect, thereby optimizing the electrical performance of the semiconductor structure.

14 Claims, 8 Drawing Sheets

(51) Int. Cl.
*H01L 29/66* (2006.01)
*H01L 29/78* (2006.01)
*H01L 27/092* (2006.01)
*H01L 21/8238* (2006.01)

(52) U.S. Cl.
CPC .. *H01L 21/823821* (2013.01); *H01L 27/0924* (2013.01); *H01L 29/6681* (2013.01); *H01L 29/785* (2013.01)

SEMICONDUCTOR STRUCTURE AND METHOD FOR FORMING THE SAME

RELATED APPLICATIONS

The present application claims priority to Chinese Patent Appln. No. 201910086398.8, filed Jan. 29, 2019, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming same.

Related Art

During semiconductor manufacturing, with the development tendency of ultra-large-scale integrated circuits, a characteristic dimension of an integrated circuit is continuously reduced. To adapt to the smaller characteristic dimension, a channel length of a metal-oxide-semiconductor field-effect transistor (MOSFET) is also continuously reduced. However, with the reduction of the channel length of the device, a distance between a source and a drain of the device is shortened. Therefore, the control capability of a gate structure for the channel becomes worse, and it is increasingly difficult for a gate voltage to pinch off the channel. Consequently, a subthreshold leakage phenomenon, that is, a so-called short-channel effect (SCE) occurs more easily.

Therefore, to better adapt to the reduction of the characteristic dimension, the semiconductor process gradually begun a transition from a planar MOSFET to a three-dimensional transistor having higher efficacy, such as a fin field effect transistor (FinFET). In the FinFET, a gate structure may at least control an ultra thin body (fin) from two sides. Compared with the planar MOSFET, the gate structure has a stronger control capability for the channel, and can well suppress the SCE; and compared with other devices, the FinFET can be better compatible with the existing integrated circuit manufacturing.

SUMMARY

A problem to be addressed in embodiments and implementations of the present disclosure is to provide a semiconductor structure and a method for forming the same, to optimize the electrical performance of the semiconductor structure.

One form of the present disclosure provides a method for forming a semiconductor structure. The method may include: providing a base, where the base includes a substrate, discrete initial fins protruding out of the substrate, and one or more initial channel laminated layers located on the initial fins, and the initial channel laminated layer includes an initial sacrificial layer and an initial channel layer located on the initial sacrificial layer; etching the initial sacrificial layer along an extension direction perpendicular to the initial channel laminated layer, to form a first groove encircled by the initial channel layer and a residual initial sacrificial layer or encircled by the initial channel layer, the residual initial sacrificial layer, and the initial fins; forming a first inside wall in the first groove; etching the initial channel laminated layer and the initial fins after the first inside wall is formed, and forming a through groove in the initial channel laminated layer and the initial fins, where the through groove extends along the extension direction of the initial channel laminated layer, a residual initial fin is used as a fin, the residual initial channel laminated layer located on the fin is used to form a channel laminated layer, the channel laminated layer includes a composite layer and a channel layer located on the composite layer, and the composite layer includes the first inside wall and a sacrificial layer located on a sidewall of the first inside wall; forming a pseudo gate structure across the channel laminated layer after the fin is formed, where the pseudo gate structure covers a partial top wall and a partial sidewall of the channel laminated layer; forming a source-drain doping layer in channel laminated layers on two sides of the pseudo gate structure; and removing the pseudo gate structure and the sacrificial layer after the source-drain doping layer is formed, and forming a metal gate structure at positions of the pseudo gate structure and the sacrificial layer.

In another form of the present disclosure, a semiconductor structure is provided. The semiconductor structure may include: a substrate; a plurality of fins, discrete on the substrate; source-drain doping layers, discrete on the fins; one or more composite laminated layers, located between the source-drain doping layers, and in contact with the source-drain doping layers, where the composite laminated layer is in contact with the fin; the composite laminated layer includes a first inside wall and a channel layer located on the first inside wall, the first inside wall and the channel layer are in a same extension direction, and along an extension direction perpendicular to the fin, and a width of the first inside wall is less than that of the channel layer; and a metal gate structure, across the composite laminated layer and around the channel layer exposed by the first inside wall.

Compared with the prior art, technical solutions of embodiments and implementations of the present disclosure have the following advantages:

In embodiments and implementations of the present disclosure, the initial sacrificial layer is etched, to form a first groove encircled by the initial channel layer and the residual initial sacrificial layer or encircled by the initial channel layer, the residual initial sacrificial layer, and the initial fin; a first inside wall is formed in the first groove; and the initial channel laminated layer and the initial fin are etched after the first inside wall is formed, and a through groove is formed in the initial channel laminated layer and the initial fin. The through groove extends along an extension direction of the initial channel laminated layer, the residual initial channel laminated layer is used to form a channel laminated layer, the channel laminated layer includes a composite layer and a channel layer located on the composite layer, and the composite layer includes the first inside wall and a sacrificial layer located on a sidewall of the first inside wall. After the sacrificial layer is subsequently removed, the first inside wall can provide support for the channel layer, and the middle position of the channel layer may not be in a vacant state. Therefore, even though the channel layer is relatively long, the channel layer cannot deform or collapse under the gravity effect, so that the semiconductor structure is stable, thereby optimizing the electrical performance of the semiconductor structure.

DETAILED DESCRIPTION

Figure 1:
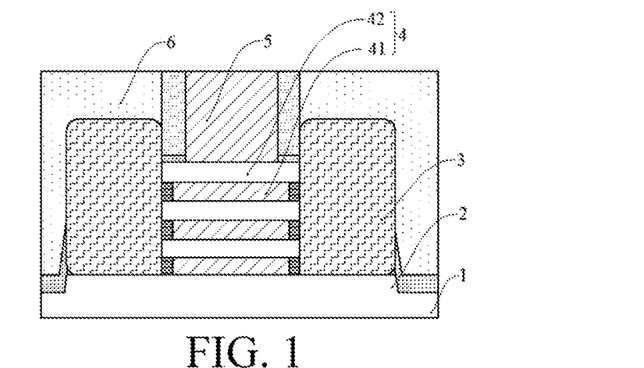
FIG. 1 to FIG. 2 are schematic structural diagrams corresponding to steps in a method for forming a semiconductor structure.
Figure 2:
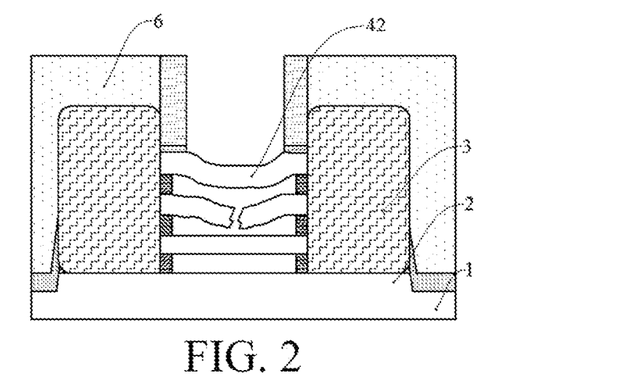

Referring to FIG. 1 to FIG. 2, FIG. 1 to FIG. 2 are schematic structural diagrams corresponding to steps in a method for forming a semiconductor structure.

As shown in FIG. 1, a base is provided, where the base includes a substrate 1 and a plurality of fins 2 discrete on the substrate 1; source-drain doping layers 3, discrete on the fin 2; and one or more channel laminated layers 4, located between the source-drain doping layers 3, and in contact with the source-drain doping layer 3. The channel laminated layer 4 is located above the fin 2, and the channel laminated layer 4 includes a sacrificial layer 41 and a channel layer 42 located on the sacrificial layer 41. A pseudo gate structure 5 is located on the fin 2, and the pseudo gate structure 5 is across the channel laminated layer 4. A dielectric layer 6 covers the source-drain doping layer 3 and a sidewall of the pseudo gate structure 5.

As shown in FIG. 2, the pseudo gate structure 5 and the sacrificial layer 41 are removed, to provide space for subsequently forming a metal gate structure fully around the channel layer 41.

Generally, along a direction perpendicular to the sidewall of the pseudo gate structure 5 (as shown in FIG. 1), if the length of the channel layer 42 exceeds 100 nm, the channel layer 42 is referred to as a long channel layer. Because the channel layer 42 is excessively long, after the sacrificial layer 41 is removed, the channel layer 42 is vacant, and because there is no support below the middle position of the channel layer 42, the channel layer 42 is easily bent or broken at the middle position under the gravity effect. After the metal gate structure is subsequently formed, the channel layer 42 cannot easily develop the normal effect, so that the yield of the semiconductor structure is not high.

To address the technical problem, in some implementations of the present disclosure, an initial sacrificial layer is etched, to form a first groove encircled by an initial channel layer and an initial sacrificial layer or encircled by an initial channel layer, an initial sacrificial layer, and an initial fin; a first inside wall is formed in the first groove; an initial channel laminated layer and the initial fin are etched after the first inside wall is formed, and a through groove is formed in the initial channel laminated layer and the initial fin. The through groove extends along an extension direction of the initial channel laminated layer, the residual initial channel laminated layer is used to form a channel laminated layer, the channel laminated layer includes a composite layer and a channel layer located on the composite layer, and the composite layer includes a first inside wall and a sacrificial layer located on a sidewall of the first inside wall. After the sacrificial layer is subsequently removed, the first inside wall can provide support for the channel layer, the middle position of the channel layer may not be in a vacant state. Therefore, even though the channel layer is relatively long, the channel layer cannot easily deform or collapse under the gravity effect, so that the semiconductor structure is stable, thereby optimizing the electrical performance of the semiconductor structure.

To make the foregoing objectives, features, and advantages of the embodiments of the present disclosure clearer and more comprehensible, the following describes specific embodiments and implementations of the present disclosure in detail with reference to the accompanying drawings.

FIG. 3 to FIG. 19 are schematic structural diagrams corresponding to steps in one form of a method for forming a semiconductor structure according to the present disclosure.

Figure 3:
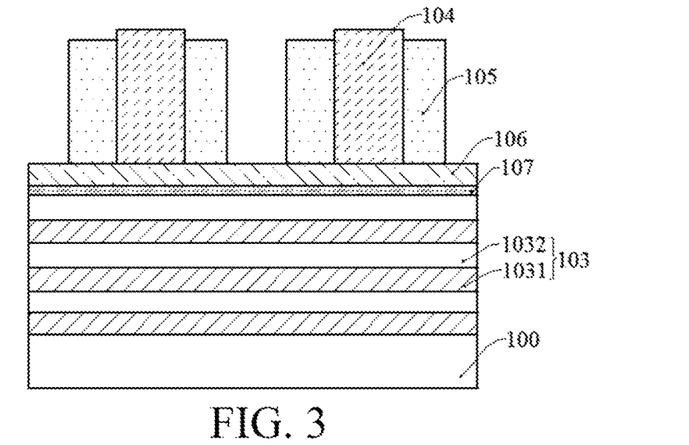
FIG. 3 to FIG. 19 are schematic structural diagrams corresponding to steps in one form of a method for forming a semiconductor structure according to the present disclosure.
Figure 4:
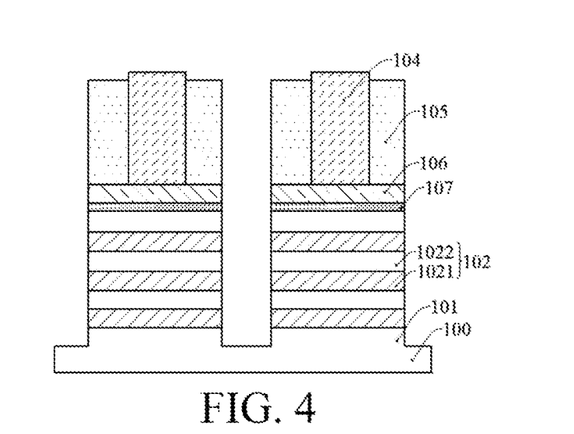

Referring to FIG. 3 to FIG. 4, a base is provided, where the base includes a substrate 100, discrete initial fins 101 (as shown in FIG. 4) protruding out of substrate 100, and one or more initial channel laminated layers 102 (as shown in FIG. 4) located on the initial fin 101. The initial channel laminated layer 102 includes an initial sacrificial layer 1021 and an initial channel layer 1022 located on the initial sacrificial layer 1021.

In some implementations, the substrate 100 is a Si substrate. In other implementations, the material of the substrate may also be another material such as Ge, SiGe, SiC, GaAs, or InGa. The substrate can also be a substrate of another type, such as a Si substrate on an insulator or a Ge substrate on an insulator.

The initial channel laminated layer 102 makes preparation for subsequently forming a channel laminated layer. The step of forming the initial channel laminated layer 102 includes: forming one or more channel laminated films 103 (as shown in FIG. 3) covering the substrate 100, where the channel laminated film 103 includes a sacrificial film 1031 (as shown in FIG. 3) and a channel film 1032 (as shown in FIG. 3) located on the sacrificial film 1031; forming a core layer 104 on the channel laminated film 103 and a mask layer 105 located on a sidewall of the core layer 104; and etching the channel laminated film 103 by using the core layer 104 and the mask layer 105 as masks, to form the initial channel laminated layer 102.

In some implementations, the etching difficulty of the channel film 1032 is greater than the etching difficulty of the sacrificial film 1031. The initial channel laminated layer 102 is subsequently etched to form the channel laminated layer, where the channel laminated layer includes a sacrificial layer and a channel layer located on the sacrificial layer, the material of the sacrificial layer is the same as the material of the sacrificial film 1031, and the material of the channel layer is the same as the material of the channel film 1032. During the removing of the sacrificial layer, the channel layer cannot be damaged easily.

In some implementations, the material of the sacrificial film 1031 is SiGe. In some implementations, the sacrificial film 1031 is formed \ using an epitaxial growth process. The lattice structure cannot be easily damaged using the epitaxial growth process, so that the subsequently formed semiconductor structure cannot easily leak electricity.

In some implementations, the material of the channel film 1032 is Si. In other implementations, the material of the channel film may also be another material such as Ge, SiGe, SiC, GaAs, or InGa. In some implementations, the sacrificial film 1032 is formed using an epitaxial growth process. The lattice structure cannot be easily damaged using the epitaxial growth process, so that the subsequently formed semiconductor structure cannot easily leak electricity.

In some implementations, the core layer 104 and the mask layer 105 have a relatively large etching selective ratio. When the core layer 104 is subsequently etched and removed, the etching rate of the core layer 104 is greater than the etching rate of the mask layer 105, so that the mask layer 105 is less damaged.

It should be noted that, the width of the core layer 104 is the same as the interval between subsequently formed neighboring channel laminated layers. In some implementations, the width refers to the width along an extension direction perpendicular to the initial channel laminated layer 102.

Specifically, the material of the core layer 104 includes one or more of a-Si, a-C, and a-Ge. The core layer 104 may be removed subsequently using an oxidation process, to help reduce the process operation difficulty in subsequently removing the core layer 104, simplify the process procedure, and improve the process manufacturing efficiency, and further help reduce the impact of the subsequent process manufacture procedure on the core layer 104 and the semiconductor structure.

The mask layer 105 is used as an etching mask for subsequently forming the fin. Therefore, the width of the mask layer 105 is the same as the width of the subsequently formed fin.

Specifically, the material of the mask layer 105 includes one or more of SiN, SiON, SiC, SiCN, SiOCN, SiON, BN and BCN.

The initial fin 101 makes preparation for subsequently forming the fin. The step of forming the initial fin 101 includes: etching the substrate 100 using the core layer 104 and the mask layer 105 as masks after the initial channel laminated layer 102 is formed, to form the initial fin 101 on the residual substrate 100.

It should be noted that, the initial fin 101 is formed by etching the substrate 100. Therefore, the material of the initial fin 101 is the same as the material of the substrate 100. In other implementations, the material of the initial fin may also be different from the material of the substrate.

It should be noted that, the semiconductor structure further includes: forming a channel mask material layer 106 on the channel laminated film 103 at the very top. Correspondingly, the core layer 104 and the mask layer 105 are also located on the channel mask material layer 106.

In some implementations, the material of the channel mask material layer 106 is SiN. In other implementations, the material of the channel mask material layer may also be one or more of SiC, SiCN, SiOCN, SiON, BN, and BCN.

It should be noted that, a buffer layer 107 is further formed between the channel mask material layer 106 and the channel laminated film 103 at the very top. The buffer layer 107 has a stress cushioning effect, so that the channel mask material layer 106 can be well formed on the channel laminated film 103, to improve the adhesion between the channel mask material layer 106 and the channel laminated film 103, so that the channel mask material layer 106 cannot easily fall off. In some implementations, the material of the buffer layer 107 is SiO.

Figure 5:
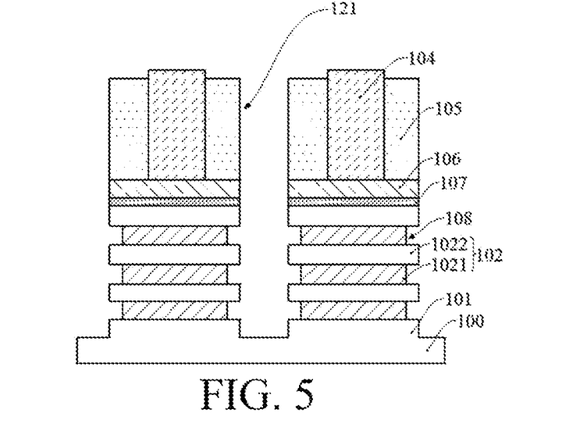

Referring to FIG. 5, the initial sacrificial layer 1021 is etched along the extension direction perpendicular to the initial channel laminated layer 102, to form a first groove 108 encircled by the initial channel layer 1022 and the residual initial sacrificial layer 1021 or encircled by the initial channel layer 1022, the residual initial sacrificial layer 1021, and the initial fin 101.

The first groove 108 provides a spatial position for subsequently forming the first inside wall.

In some implementations, the initial sacrificial layer 1021 of a partial width is etched along an extension direction perpendicular to the initial channel laminated layer 102 using a wet etching process, to form the first groove 108. In the procedure of wet etching the initial sacrificial layer 1021, the etching rate of the initial sacrificial layer 1021 is greater than the etching rate of the initial channel layer 1022. The wet etching process has an isotropic etching feature, and the initial sacrificial layer 1021 can be easily etched along the extension direction perpendicular to the initial channel laminated layer 102, to form the first groove 108. In other implementations, the initial sacrificial layer of the partial width may also be removed using a dry etching process.

Specifically, the material of the initial sacrificial layer 1021 is SiGe, and the wet etching solution is an HCl solution.

In some implementations, the width of the first groove 108 should not be excessively large or excessively small. The initial channel laminated layer 102 and the initial fin 101 are subsequently etched, and a through groove is formed in the initial channel laminated layer 102 and the initial fin 101, where the through groove extends along the extension direction of the initial channel laminated layer 102, the residual initial channel laminated layer 102 is used to form a channel laminated layer, the channel laminated layer includes a composite layer and a channel layer located on the composite layer, and the composite layer includes a first inside wall and a sacrificial layer located on a sidewall of the first inside wall. After the sacrificial layer is subsequently removed, the first inside wall can provide support for the channel layer. If the width of the first groove 108 is excessively small, the width of the first inside wall subsequently formed in the first groove 108 is relatively narrow, so that the first inside wall cannot easily provide strong support for the channel layer, and the channel layer easily deforms or collapses. This cannot help stabilize the semiconductor structure, and cannot help optimize the electrical performance of the semiconductor structure. If the width of the first groove 108 is excessively large, the sacrificial layer subsequently formed on the sidewall of the first inside wall is excessively narrow, and correspondingly, the sacrificial layer is subsequently removed, and the metal gate structure formed at the original position of the sacrificial layer is also excessively narrow, so that the channel control capability of the metal gate structure in the channel layer is weakened. This cannot help improve the electrical performance of the semiconductor structure. In some implementations, the width of the first groove 108 is a first value. The width of the subsequently formed channel layer is a second value, and the first value is ⅓ to ½ the second value.

Figure 6:
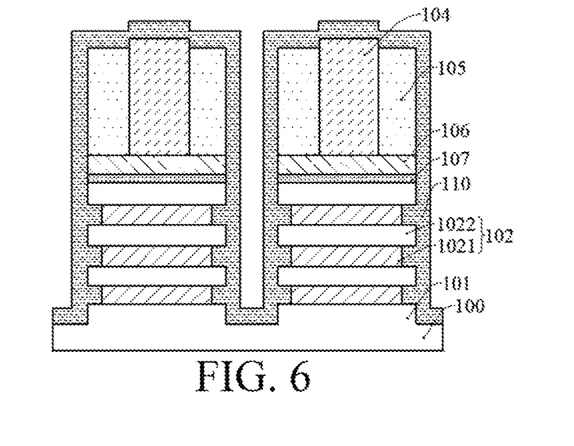
Figure 7:
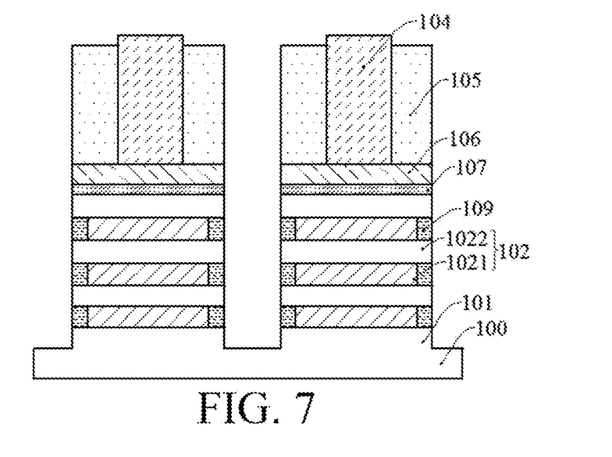

Referring to FIG. 6 and FIG. 7, a first inside wall 109 is formed in the first groove 108 (as shown in FIG. 5).

The initial channel laminated layer 102 and the initial fin 101 are subsequently etched, and a through groove is formed in the initial channel laminated layer 102 and the initial fin 101. The through groove extends along the extension direction of the initial channel laminated layer 102, the residual initial channel laminated layer 102 is used to form a channel laminated layer, the channel laminated layer includes a composite layer and a channel layer located on the composite layer, and the composite layer includes a first inside wall 109 and a sacrificial layer located on a sidewall of the first inside wall 109. After the sacrificial layer is subsequently removed, the first inside wall 109 can provide support for the channel layer. Therefore, even though the channel layer is relatively long, the channel layer cannot easily deform or collapse, so that the semiconductor structure is stable, thereby optimizing the electrical performance of the semiconductor structure.

The step of forming the first inside wall 109 in the first groove 108 includes: forming a first inside wall material layer 110 conformally covering the initial channel laminated layer 102 and the substrate 100 exposed by the initial channel laminated layer 102; and removing the first inside wall material layer 110 exposing the first groove 109, and reserving the first inside wall material layer 110 located in the first groove 109 as the first inside wall 109.

In some implementations, the first inside wall material layer 110 is formed using an atomic layer deposition process. The atomic layer deposition process has a relatively good conformal coverage capability, to help ensure that in the step of forming the first inside wall material layer 110, the first inside wall material layer 110 can be well filled in the first groove 108, to make preparation for subsequently forming the first inside wall. In other implementations, the first inside wall material layer may also be formed by using a chemical vapor deposition process.

In some implementations, the material of the first inside wall 109 includes one or more of Si, SiC, SiCN, SiOCN, SiON, BN, and BCN.

The step of removing the first inside wall material layer 110 exposing the first groove 109 includes: etching and removing the core layer 104 and the first inside wall material layer 110 on the mask layer 105; and by using the core layer 104 and the mask layer 105 as masks, etching and removing the first inside wall material layer 110 exposing the first groove 108, to form the first inside wall 109.

In some implementations, the first inside wall material layer 110 exposing the first groove 108 is removed using a dry etching process, to form the first inside wall 109.

It should be noted that, the width of the first groove 108 is ⅓ to ½ the width of the subsequent channel layer; and correspondingly, the width of the first inside wall 109 is ⅓ to ½ the width of the subsequent channel layer.

Specifically, the width of the first groove 108 is 2 nm to 5 nm. Correspondingly, the width of the first inside wall 109 is also 2 nm to 5 nm.

It should be noted that, in other implementations, the first inside wall material layer may also be formed in the first groove using a selective epitaxial growth method, and then, the first inside wall material layer exposing the first groove is removed to form the first inside wall located in the first groove.

Figure 8:
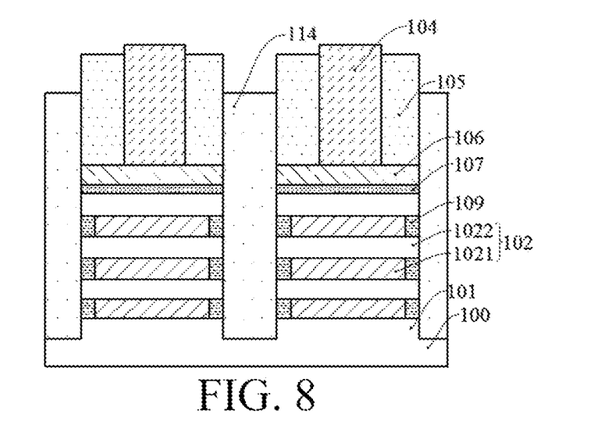
Figure 9:
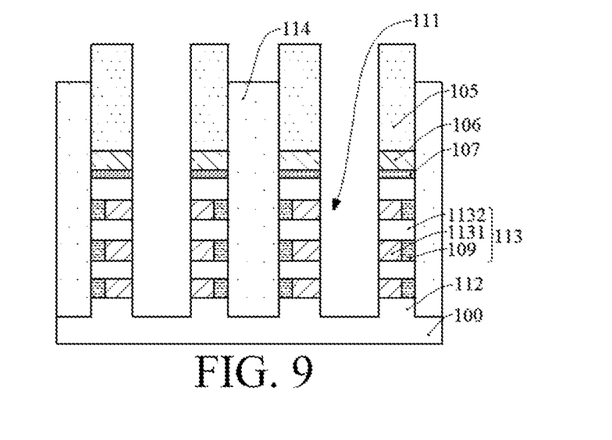

Referring to FIG. 8 and FIG. 9, after the first inside wall 109 is formed, the initial channel laminated layer 102 and the initial fin 101 are etched, and a through groove 111 is formed in the initial channel laminated layer 102 and the initial fin 101. The through groove 111 extends along an extension direction of the initial channel laminated layer 102, the residual initial fin 101 is used as a fin 112, the residual initial channel laminated layer 102 located on the fin 112 is used to form a channel laminated layer 113, the channel laminated layer 113 includes a composite layer (not marked) and a channel layer 1132 located on the composite layer, and the composite layer includes a first inside wall 109 and a sacrificial layer 1131 located on a sidewall of the first inside wall 109.

The channel laminated layer 113 makes preparation for subsequently forming a pseudo gate structure around the first inside wall 109.

In some implementations, the method may further include: after the first inside wall 109 is formed and before the initial channel laminated layer 102 is etched, removing the core layer 104. The core layer 104 is removed to expose a region between neighboring mask layers 105, thereby providing a process basis for subsequently etching the initial channel laminated layer 102 and the initial fin 101.

Correspondingly, in the step of etching the initial channel laminated layer 102, the mask layer 105 is used as a mask to perform etching.

In some implementations, by using the mask layer 105 as a mask, the initial channel laminated layer 102 is etched using a dry etching process, to form the channel laminated layer 113.

It should be noted that, the initial channel laminated layer 102 is obtained through etching by using the core layer 104 and the mask layer 105 as masks, the mask layer 105 is located on a sidewall of the core layer 104, the first inside wall 109 is located on a sidewall of the initial channel laminated layer 102, and the mask layer 105 is used as a mask to remove the initial channel laminated layer 102 exposing the mask layer 105. Therefore, the formed channel laminated layer 113 has the first inside wall 109 and the sacrificial layer 1131 located on the sidewall of the first inside wall 109.

It should be noted that, the width of the channel layer 1032 is two to three times the width of the first inside wall 109, the width of the first inside wall 109 is 2 nm to 5 nm, and correspondingly, the width of the channel layer 1032 is 4 nm to 15 nm.

Still referring to FIG. 8, the step of forming the channel laminated layer 113 further includes: forming a protective layer 114 on the substrate 100 exposed by the initial channel laminated layer 102; and etching the initial channel laminated layer 102 after the protective layer 114 is formed, to form the channel laminated layer 113. The protective layer 114 is used to protect the substrate 100 from being easily etched wrongly in the procedure of etching the initial channel laminated layer 102 to form the channel laminated layer 113.

In some implementations, the protective layer 114 is formed before the core layer 104 is removed, to prevent the protective layer 114 from being formed on a to-be-etched region, to ensure the normal operation of the etching process.

In some implementations, the material of the protective layer 114 may be a bottom anti-reflective coating (BARC) material, an organic dielectric layer (ODL) material, a photoresist, a dielectric anti-reflective coating (DARC) material, a deep UV light absorbing oxide (DUO) material, or an advanced patterning film (APF) material.

In some implementations, the protective layer 114 is formed using a spin coating process.

Figure 10:
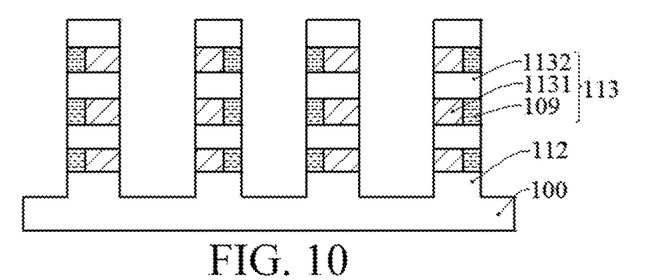

Referring to FIG. 10, the method for forming a semiconductor structure further includes: removing the protective layer 114 (as shown in FIG. 9) after the channel laminated layer 113 is formed. The protective layer 114 is removed to provide space for subsequently forming a pseudo gate structure.

In some implementations, the protective layer 114 is removed using an ashing process or a dry etching process.

In some implementations, the mask layer 105 is further removed after the protective layer 114 is removed, to make preparation for subsequently forming a pseudo gate structure across the channel laminated layer 113.

In some implementations, the mask layer 105 is removed using a wet etching process. In the procedure of removing the mask layer 105 using the wet etching process, the etching rate of the mask layer 105 is greater than the etching rates of the channel laminated layer 113 and the substrate 100. Specifically, in some implementations, the mask layer 105 is removed using a phosphoric acid solution.

It should be noted that, after the mask layer 105 is removed, the channel mask material layer 106 and the buffer layer 107 are further removed.

Figure 11:
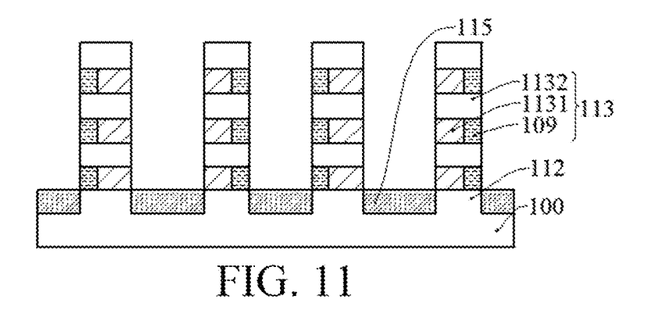

Referring to FIG. 11, after the mask layer 105 (as shown in FIG. 9) is removed, an isolation layer 115 is formed on the substrate 100 exposed by the fin 112. The isolation layer 115 is used to implement electrical isolation between the fins 112.

In some implementations, the material of the isolation layer 115 includes SiO. In other implementations, the material of the isolation layer may also include one or more of SiN, SiCN, SiOCN, SiON, BN, and BCN.

It should be noted that, the top face of the isolation layer 115 is not higher than the top wall of the fin 112, to help subsequently remove the sacrificial layer 1031.

The step of forming the isolation layer 115 includes: forming an isolation material layer (not shown in the figure) on the substrate 100 exposed by the fin 112; and performing planarization processing on the isolation material layer, and etching back the isolation material layer of a partial thickness to form the isolation layer 115.

In some implementations, the isolation material layer is formed using a flowable chemical vapor deposition (FCVD) process.

In some implementations, the planarization processing is performed on the isolation material layer by using a chemical-mechanical planarization (CMP) process.

Figure 12:
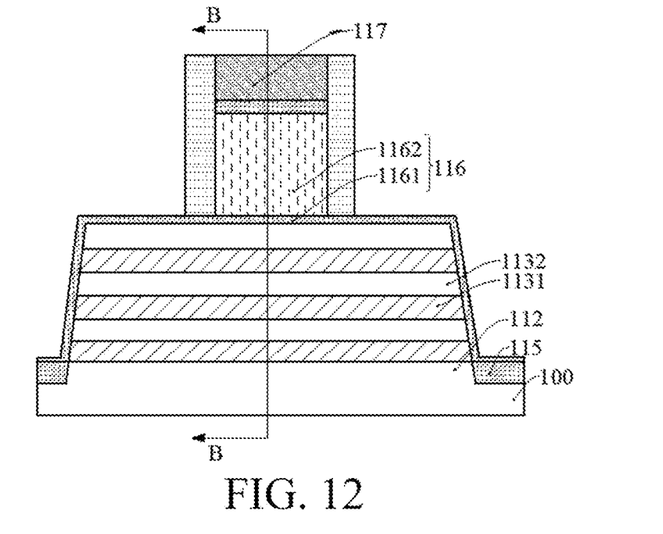
Figure 13:
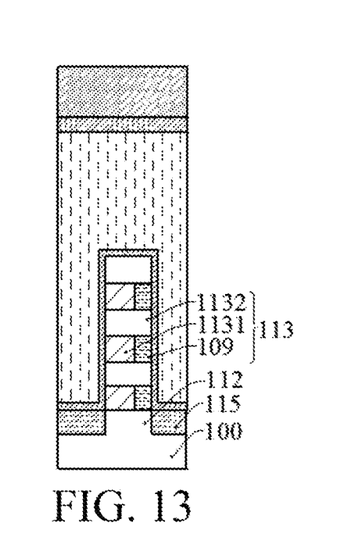

Referring to FIG. 12 and FIG. 13, FIG. 13 is a sectional view along direction B-B in FIG. 12. After the fin 112 is formed, a pseudo gate structure 116 across the channel laminated layer 113 is formed, where the pseudo gate structure 116 covers a partial top wall and a partial sidewall of the channel laminated layer 113.

The pseudo gate structure 116 occupies a spatial position for forming a metal gate structure in the subsequent manufacture procedure. The pseudo gate structure 116 includes a pseudo gate oxidation layer 1161 conformally covering the partial top face and the partial sidewall of the channel laminated layer 113, and the pseudo gate structure 116 further includes a pseudo gate layer 1162 located on the pseudo gate oxidation layer 1161. In some implementations, the pseudo gate structure 116 is a laminated structure. In other implementations, the pseudo gate structure may also be a single-layer structure, that is, the pseudo gate material structure only includes a pseudo gate layer.

Specifically, the step of forming the pseudo gate structure 116 includes: after the pseudo gate oxidation material layer (not shown in the figure) conformally covering the channel laminated layer 113 is formed, forming the pseudo gate material layer across the channel laminated layer 113 on the pseudo gate oxidation material layer; forming a gate mask layer 117 on the pseudo gate material layer; and etching the pseudo gate material layer and the pseudo gate oxidation material layer sequentially by using the gate mask layer 117 as a mask, to form a pseudo gate oxidation layer 1161 and a pseudo gate layer 1162 located on pseudo gate oxidation layer 1161, where the pseudo gate oxidation layer 1161 and the pseudo gate layer 1162 cover the partial top face of and the partial sidewall of the channel laminated layer 113.

In some implementations, the material of the pseudo gate oxidation layer 1161 is SiO. In other implementations, the material of the pseudo gate oxidation layer may also be SiON. In some implementations, the material of the pseudo gate layer 1162 is Poly-Si. In other implementations, the material of the pseudo gate layer may also be SiO, SiN, SiON, SiC, SiCN, SiOCN, or a-C.

It should be noted that, after the pseudo gate structure 116 is formed, the gate mask layer 117 located on the top of the pseudo gate structure 116 is reserved. The material of the gate mask layer 117 is SiN, and the gate mask layer 117 is used to have a protection effect for the top of the pseudo gate structure 116 in the subsequent process procedure.

Figure 14:
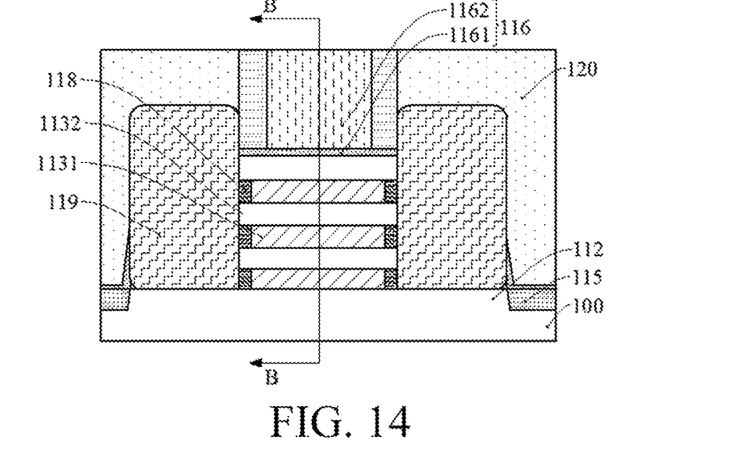
Figure 15:
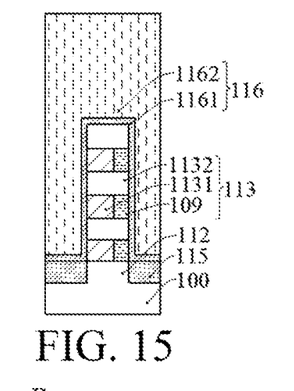

Referring to FIG. 14 and FIG. 15, FIG. 14 is a sectional view based on FIG. 12, and FIG. 15 is a sectional view at B-B in FIG. 14. A source-drain doping layer 119 is formed in channel laminated layers 113 on two sides of the pseudo gate structure 116.

The step of forming the source-drain doping layer 119 includes: forming a laminated groove (not shown in the figure) in the channel laminated layer 113 on the two sides of the pseudo gate structure 116, and forming the source-drain doping layer 119 in the laminated groove.

In some implementations, the step of forming the laminated groove includes: etching the channel laminated layer 113 until the top of the fin 112 is exposed, to form the laminated groove. In other implementations, the step of forming the laminated groove includes: etching the channel laminated layer and the top of the fin of a partial thickness, to form the laminated groove.

In some implementations, the channel laminated layers 113 on the two sides of the pseudo gate structure 116 are etched using a dry etching process, to form the laminated groove. In other implementations, the channel laminated layer on the two sides of the pseudo gate structure may also be etched using a wet etching process, to form the laminated groove.

In some implementations, an epitaxial layer epitaxially grows in the laminated groove using a selective epitaxial growth method, and ions are in-situ doped in the procedure of forming the epitaxial layer. Annealing processing is performed on the epitaxial layer doped with ions, to form the source-drain doping layer 119.

In some implementations, the semiconductor device is a negative channel metal oxide semiconductor (NMOS), and the material of the source-drain doping layer 119 is P doped SiC or SiP. In some implementations, P ions are doped in SiC or SiP, so that P ions replace the position of Si atoms in the lattice. If more P ions are doped, the majority carrier concentration is higher, and the electrical conductivity is also stronger. In other implementations, the doped ions may also be As.

In other implementations, the semiconductor device is a positive channel metal oxide semiconductor (PMOS). The material of the source-drain doping layer is B doped SiGe. In some implementations, B ions are doped in SiGe, so that B ions replace the position of Si atoms in the lattice. If more B ions are doped, the majority carrier concentration is higher, and the electrical conductivity is also stronger. In other implementations, the doped ions may also be In or Ga.

It should be noted that, the method for forming a semiconductor structure further includes: after the laminated groove is formed and before the source-drain doping layer 119 is formed, the method further includes: etching the sacrificial layer 1131 of a partial thickness on a sidewall of the laminated groove, to form a second groove (not shown in the figure) encircled by the sacrificial layer 1131, the first inside wall 109, and the channel layer 1132, or form a second groove encircled by the sacrificial layer 1131, the first inside wall 109, the channel layer 1132, and the fin 112, and forming a second inside wall 118 in the second groove.

The second inside wall 118 is used to reduce the capacitance coupling effect between the source-drain doping layer 119 and the subsequently formed metal gate structure, to further reduce the stray capacitance, and improve the electrical performance of the transistor structure.

Specifically, in some implementations, the sacrificial layer 1131 of the partial thickness on the sidewall of the laminated groove is removed using a wet etching process, to form the second groove. In some implementations, the material of the channel layer 1132 is Si, the material of the sacrificial layer 1131 is SiGe, and the step of forming the second groove includes: etching the sacrificial layer on the sidewall of the laminated groove by using an HCl solution.

The step of forming the second inside wall 118 includes: forming a second inside wall material layer (not shown in the figure) conformally covering the laminated groove and the pseudo gate structure 116; and removing the second inside wall material layer exposing the second groove, to form the second inside wall 118.

In some implementations, the second inside wall material layer is formed using a chemical vapor deposition process. In other implementations, the second inside wall material layer may also be formed using an atomic layer deposition process.

In some implementations, the second inside wall 118 uses the material of a low-K dielectric constant, and the material of the second inside wall 118 is C doped or O doped SiN. In other implementations, the material of the second inside wall may also be the material of a low-K dielectric constant, such as SiON, SiBCN, or SiCN.

Still referring to FIG. 14, after the source-drain doping layer 119 is formed, an interlayer dielectric layer 120 covering the source-drain doping layer 119 is formed, and the interlayer dielectric layer 120 exposes the top of the pseudo gate structure 116.

The interlayer dielectric layer 120 is used to implement electrical isolation between neighboring transistors. Therefore, the material of the interlayer dielectric layer 120 is an insulating material. In some implementations, the material of the interlayer dielectric layer 120 is SiO. In other implementations, the material of the interlayer dielectric layer may also be one or more of SiN, SiON, SiOC, SiCN, and SiOCN.

Specifically, the step of forming the interlayer dielectric layer 120 includes: forming an interlayer dielectric material layer (not shown in the figure) on the substrate 100 exposed by the pseudo gate structure 116 and the pseudo gate structure 116, where the interlayer dielectric material layer covers the top of the pseudo gate structure 116; and performing planarization processing on the interlayer dielectric material layer, and removing the interlayer dielectric material layer higher than the pseudo gate structure 116, where the residual interlayer dielectric material layer obtained after the planarization processing is used as the interlayer dielectric layer 120.

In some implementations, in the procedure of forming the interlayer dielectric layer 120, the gate mask layer 117 (as shown in FIG. 13) is further removed.

Figure 16:
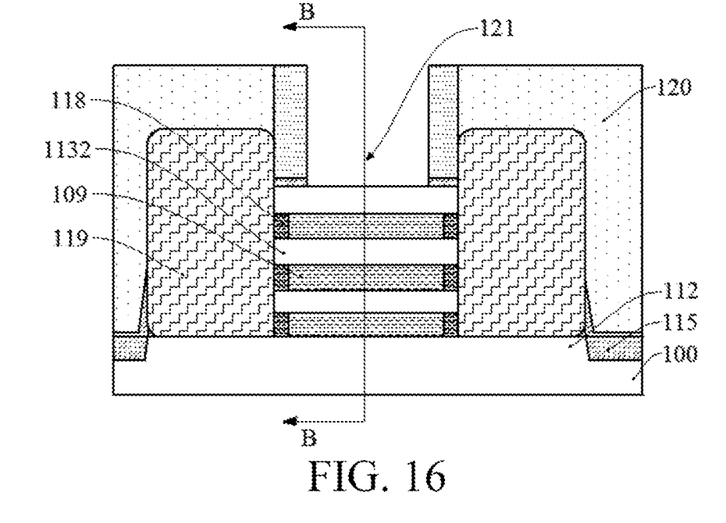
Figure 17:
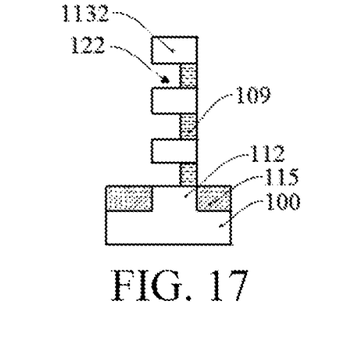

Referring to FIG. 16 and FIG. 17, FIG. 16 is a sectional view based on FIG. 14, and FIG. 17 is a sectional view at B-B in FIG. 16. After the source-drain doping layer 119 is formed, the pseudo gate structure 116 is removed, and a gate opening 121 is formed at the position of the pseudo gate structure 116. The sacrificial layer 1131 is removed, and a passage 122 in communication with the gate opening 121 is formed at the position of the sacrificial layer 1131.

The channel laminated layer 113 (as shown in FIG. 15) includes a composite layer (not shown in the figure) and a channel layer 1132 located on the composite layer, where the composite layer includes a first inside wall 109 and a sacrificial layer 1131 (as shown in FIG. 14) located on a sidewall of the first inside wall 109. After the sacrificial layer 1131 is removed, the first inside wall 109 can provide support for the channel layer 1132. Therefore, even though the channel layer 1132 is relatively long, the channel layer 1132 cannot easily deform or collapse under the gravity effect, so that the semiconductor structure is stable, thereby optimizing the electrical performance of the semiconductor structure.

In some implementations, the gate opening 121 exposes a partial top face and a partial sidewall of the channel layer 1022 at the very top.

In some implementations, the step of removing the pseudo gate structure 116 to form the gate opening 121 includes: removing a pseudo gate layer 1162 and a pseudo gate oxidation layer 1161 located below the pseudo gate layer 1162.

The sacrificial layer 1131 is removed to form a passage 122 encircled by the second inside wall 118, the fin 112, and the channel layer 1132, or encircled by the second inside wall 118 and the channel layer 1132, and the passage 122 is in communication with the gate opening 121.

In some implementations, the sacrificial layer 1131 is removed using a wet etching process, to form the passage 122. In the wet etching procedure, the etching rate of the sacrificial layer 1131 is greater than the etching rate of the channel layer 1022. Specifically, the sacrificial layer 1131 is removed by using an HCl solution, to form the passage 122.

Figure 18:
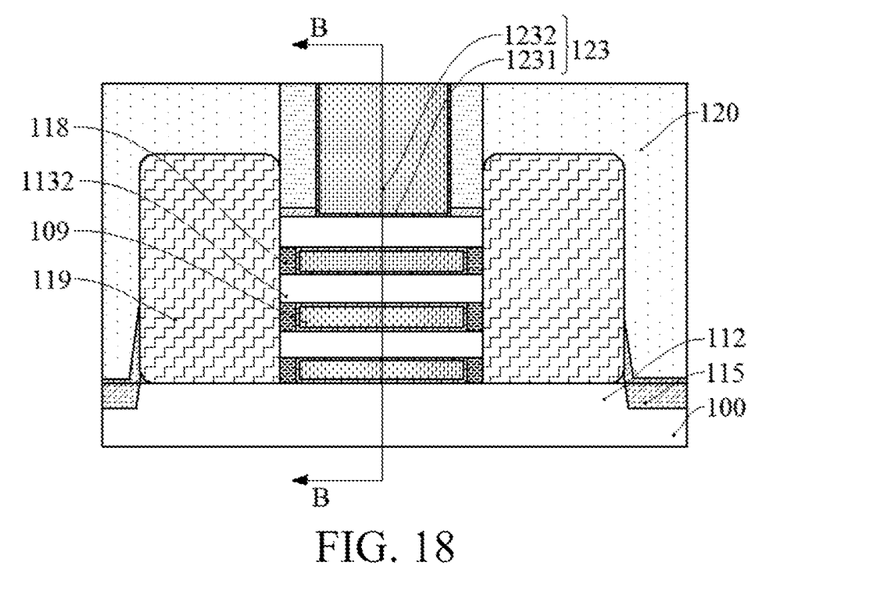
Figure 19:
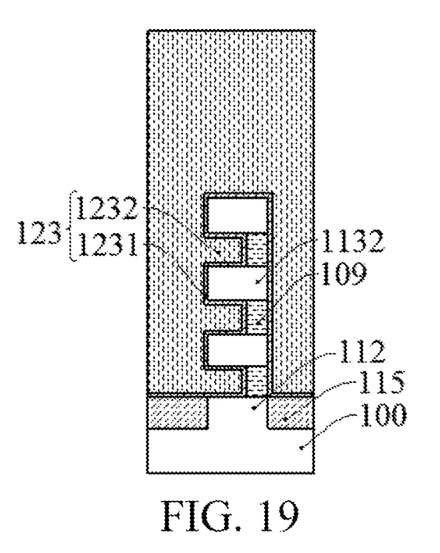

Referring to FIG. 18 and FIG. 19, FIG. 18 is a sectional view based on FIG. 16, and FIG. 19 is a sectional view of direction B-B in FIG. 18. A metal gate structure 123 is formed in the gate opening 121 and the passage 122. The metal gate structure 123 encloses the channel layer 1132 exposed by the first inside wall 109.

The step of forming the metal gate structure 123 fully around the channel layer 1022 includes: forming a gate dielectric layer 1231 conformally covering the gate opening 121 and the passage 122; and after the gate dielectric layer 1231 is formed, forming, in the gate opening 121 and the passage 122, a gate layer 1232 fully around the channel layer 1132 exposed by the first inside wall 109.

The material of the gate dielectric layer 1231 is a high-k dielectric layer, and the material of the high-k dielectric layer refers to a dielectric material whose relative dielectric constant is greater than the relative dielectric constant of SiO. In some implementations, the material of the gate dielectric layer 1231 is HfO2. In other implementations, the material of the gate dielectric layer may also be selected from one or more of ZrO2, HfSiO, HfSiON, HfTaO, HfTiO, HfZrO, or Al2O3.

The gate layer 1232 is used as an electrode, and used to implement electrical connection to an external circuit. In some implementations, the material of the gate layer 1232 is Mg—W alloy. In other implementations, the material of the gate layer may also be W, Al, Cu, Ag, Au, Pt, Ni, Ti, or the like.

Another form of the present disclosure provides a semiconductor structure. Referring to FIG. 18 and FIG. 19, FIG. 19 is a sectional view at B-B in FIG. 18, and shows a schematic structural diagram of one form of a semiconductor structure according to the present disclosure.

The semiconductor structure includes: a substrate 100; a plurality of fins 112, discrete on the substrate 100; source-drain doping layers 119, discrete on the fin 112; one or more composite laminated layers (not shown in the figure), located between the source-drain doping layers 119, and in contact with the source-drain doping layer 119, where a composite laminated layer at the very bottom is in contact with the fin 112, the composite laminated layer includes a first inside wall 109 and a channel layer 1132 located in the first inside wall 109, the first inside wall 109 and the channel layer 1132 are in the same extension direction, and along an extension direction perpendicular to the fin 112, and the width of the first inside wall 109 is less than the width of the channel layer 1132; and a metal gate structure 123, across the composite laminated layer and around the channel layer 1132 exposed by the first inside wall 109.

Before the metal gate structure 123 is formed, a sacrificial layer is formed at the position of the metal gate structure 123 below the channel layer 1132. In the procedure of forming the semiconductor structure, after the sacrificial layer is removed, the first inside wall 109 can provide support for the channel layer 1132, and the middle position of the channel layer 1132 may not be in a vacant state. Therefore, even though the channel layer 1132 is relatively long, the channel layer 1132 also cannot easily deform or collapse under the gravity effect, so that the semiconductor structure is stable, thereby optimizing the electrical performance of the semiconductor structure.

In some implementations, the width refers to the width along an extension direction perpendicular to the composite laminated layer.

In some implementations, the width of the first inside wall 109 should not be excessively large or excessively small. If the first inside wall 109 is excessively narrow, after the sacrificial layer is removed, the first inside wall 109 cannot easily provide strong support for the channel layer 1132, and the channel layer 1132 may easily deform or collapse under the gravity effect. This does not help stabilize the semiconductor structure, and does not help optimize the electrical performance of the semiconductor structure. If the first inside wall 109 is excessively wide, the sacrificial layer formed on the sidewall of the first inside wall 109 is excessively narrow, and correspondingly, the metal gate structure 123 below the channel layer 1132 is also excessively narrow, so that the channel control capability of the metal gate structure 123 for the channel layer 1132 is weakened. This does not help improve the electrical performance of the semiconductor structure. In some implementations, the width of the first inside wall 109 is ⅓ to ½ the width of the channel layer 1132.

Specifically, in some implementations, the width of the channel layer 1132 is 4 nm to 15 nm, and correspondingly, the width of the first inside wall 109 is 2 nm to 5 nm.

In some implementations, the material of the first inside wall 109 includes one or more of Si, SiC, SiCN, SiOCN, SiON, BN, and BCN.

In some implementations, one sidewall of the channel layer 1132 is aligned with one sidewall of the first inside wall 109. In other implementations, two sidewalls that are in the first inside wall and that are perpendicular to the extension direction of the metal gate structure are located between the channel layers.

In some implementations, the substrate 100 is a Si substrate. In other implementations, the material of the substrate may also be another material such as Ge, SiGe, SiC, GaAs, or InGa. The substrate can also be a substrate of another type, such as a Si substrate on an insulator or a Ge substrate on an insulator.

It should be noted that, the fin 112 is formed by etching the substrate 100. Therefore, the material of the fin 112 is the same as the material of the substrate 100. In other implementations, the material of the fin may also be different from the material of the substrate.

The isolation layer 115 is located on the substrate 100 exposed by the fin 112. The isolation layer 115 is used to implement electrical isolation between the fins 112.

In some implementations, the material of the isolation layer 115 includes SiO. In other implementations, the material of the isolation layer may also include one or more of SiN, SiCN, SiOCN, SiON, BN, and BCN. It should be noted that, the top face of the isolation layer 115 is not higher than the top wall of the fin 112.

In some implementations, the material of the channel layer 1132 is Si. In other implementations, the material of the channel layer may also be another material such as Ge, SiGe, SiC, GaAs, or InGa.

In some implementations, the semiconductor device is an NMOS, and the material of the source-drain doping layer 119 is P doped SiC or SiP. In some implementations, P ions are doped in SiC or SiP, so that P ions replace the position of Si atoms in the lattice. If more P ions are doped, the majority carrier concentration is higher, and the electrical conductivity is also stronger. In other implementations, the doped ions may also be As.

In other implementations, the semiconductor device is a PMOS. The material of the source-drain doping layer is B doped SiGe. In some implementations, B ions are doped in SiGe, so that B ions replace the position of Si atoms in the lattice. If more B ions are doped, the majority carrier concentration is higher, and the electrical conductivity is also stronger. In other implementations, the doped ions may also be In or Ga.

The metal gate structure 123 includes a gate dielectric layer 1231 and a gate layer 1232 located on gate dielectric layer 1231. The material of the gate dielectric layer 1231 is a high-k dielectric layer, and the material of the high-k dielectric layer refers to a dielectric material whose relative dielectric constant is greater than the relative dielectric constant of SiO. In some implementations, the material of the gate dielectric layer 1231 is HfO2. In other implementations, the material of the gate dielectric layer may also be selected from one or more of ZrO2, HfSiO, HfSiON, HfTaO, HfTiO, HfZrO, or Al2O3. The gate layer 1232 is used as an electrode, and used to implement electrical connection to an external circuit. In some implementations, the material of the gate layer 1232 is Mg and W alloy. In other implementations, the material of the gate layer may also be W, Al, Cu, Ag, Au, Pt, Ni, Ti, or the like.

The semiconductor structure further includes: a second inside wall 118, located between the source-drain doping layer 119 and the metal gate structure 123 below the channel layer 1132 at the very top. The second inside wall 118 is used to reduce the capacitance coupling effect between the source-drain doping layer 119 and the metal gate structure 123, to further reduce the stray capacitance, and improve the electrical performance of the transistor structure.

In some implementations, the second inside wall 118 uses the material of a low-K dielectric constant, and the material of the second inside wall 118 is C doped or O doped SiN. In other implementations, the material of the second inside wall may also be the material of a low-K dielectric constant, such as SiON, SiBCN, or SiCN.

The interlayer dielectric layer 120 is located on the source-drain doping layer 119, and covers the sidewall of the metal gate structure 123.

The interlayer dielectric layer 120 is used to implement electrical isolation between neighboring transistors. Therefore, the material of the interlayer dielectric layer 120 is an insulating material. In some implementations, the material of the interlayer dielectric layer 120 is SiO. In other implementations, the material of the interlayer dielectric layer may also be one or more of SiN, SiON, SiOC, SiCN, and SiOCN.

The semiconductor structure may be formed using implementations of the forming methods described above, or may be formed using another forming method. For specific descriptions for implementations of the semiconductor structure, reference may be made to corresponding descriptions described above. Details are not described herein again in some implementations.

Although embodiments and implementations of the present disclosure are disclosed as above, the embodiments of the present disclosure are not limited thereto. Various variations and modifications may be made by any person skilled in the art without departing from the spirit and scope of the embodiments of the present disclosure. Therefore, the protection scope of the embodiments of the present disclosure shall be subject to the scope limited by the claims.

What is claimed is:

1. A method for forming a semiconductor structure, comprising:
    providing a base, wherein the base comprises:
        a substrate,
        discrete initial fins protruding out of the substrate, and
        an initial channel laminated layer located on the initial fins, wherein the initial channel laminated layer comprises an initial sacrificial layer and an initial channel layer located on the initial sacrificial layer;
    etching the initial sacrificial layer along an extension direction perpendicular to the initial channel laminated layer, to form a first groove encircled by the initial channel layer and a residual initial sacrificial layer or encircled by the initial channel layer, the residual initial sacrificial layer, and the initial fins;
    forming a first inside wall in the first groove;
    etching the initial channel laminated layer and the initial fins after the first inside wall is formed, and forming a through groove in the initial channel laminated layer and the initial fins, wherein:
        the through groove extends along the extension direction of the initial channel laminated layer,
        a residual initial fin is used as a fin,
        a residual initial channel laminated layer located on the fin is used to form a channel laminated layer,
        the channel laminated layer comprises a composite layer and a channel layer located on the composite layer, and
        the composite layer comprises the first inside wall and a sacrificial layer located on a sidewall of the first inside wall;
    forming a pseudo gate structure across the channel laminated layer after the fin is formed, wherein the pseudo gate structure covers a partial top wall and a partial sidewall of the channel laminated layer;
    forming a source-drain doping layer in channel laminated layers on two sides of the pseudo gate structure; and
    removing the pseudo gate structure and the sacrificial layer after the source-drain doping layer is formed, and forming a metal gate structure at positions of the pseudo gate structure and the sacrificial layer.

2. The method for forming a semiconductor structure according to claim 1, wherein:
    in the step of forming the first groove, a width of the first groove has a first value;
    in the step of forming the channel layer, a width of the channel layer has a second value; and the first value is ⅓ to ½ of the second value.

3. The method for forming a semiconductor structure according to claim 1, wherein a width of the first groove is 2 nm to 5 nm.

4. The method for forming a semiconductor structure according to claim 1, wherein a material of the first inside wall comprises at least one of Si, SiC, SiCN, SiOCN, SiON, BN, or BCN.

5. The method for forming a semiconductor structure according to claim 1, wherein the step of forming a first inside wall in the first groove comprises:
    forming a first inside wall material layer conformally covering the initial channel laminated layer and the substrate exposed by the initial channel laminated layer; and
    removing the first inside wall material layer exposing the first groove, and reserving the first inside wall material layer located in the first groove as the first inside wall.

6. The method for forming a semiconductor structure according to claim 5, wherein the first inside wall material layer is formed using an atomic layer deposition process or a chemical vapor deposition process.

7. The method for forming a semiconductor structure according to claim 1, wherein the step of forming the first groove comprises:
    etching the initial sacrificial layer of a partial width by using a wet etching process.

8. The method for forming a semiconductor structure according to claim 7, wherein a solution of the wet etching process is an HCl solution.

9. The method for forming a semiconductor structure according to claim 1, wherein the step of forming the channel laminated layer comprises:
    forming a protective layer on the substrate exposed by the initial channel laminated layer; and
    etching the initial channel laminated layer after the protective layer is formed, to form the channel laminated layer.

10. The method for forming a semiconductor structure according to claim 1, wherein a material of the channel layer is Si, and a material of the sacrificial layer is SiGe.

11. The method for forming a semiconductor structure according to claim 1, wherein the sacrificial layer is removed by using a wet etching process.

12. The method for forming a semiconductor structure according to claim 11, wherein the wet etching solution is an HCl solution.

13. The method for forming a semiconductor structure according to claim 1, wherein:
    the step of forming the initial channel laminated layer comprises:
        forming a channel laminated film covering the substrate, wherein the channel laminated film comprises a sacrificial film and a channel film located on the sacrificial film;
        forming a core layer on the channel laminated film and a mask layer located on a sidewall of the core layer; and
        etching the channel laminated film using the core layer and the mask layer as masks, to form the initial channel laminated layer;
    the method further comprises: after the first inside wall is formed and before the initial channel laminated layer is etched, removing the core layer; and
    in the step of etching the initial channel laminated layer, the mask layer is used as a mask to perform etching.

14. The method for forming a semiconductor structure according to claim 1, wherein the method for forming a semiconductor structure further comprises:
    after the pseudo gate structure is formed and before the source-drain doping layer is formed, forming a laminated groove in the channel laminated layers on the two sides of the pseudo gate structure, and etching a sacrificial layer of a partial thickness on a sidewall of the laminated groove, to form a second groove encircled by the sacrificial layer, the first inside wall, and the channel layer, or form a second groove encircled by the sacrificial layer, the first inside wall, the channel layer, and the fin; and forming a second inside wall in the second groove.

\* \* \* \* \*